(12) United States Patent
Mitsubori et al.

(10) Patent No.: US 8,427,856 B2
(45) Date of Patent: Apr. 23, 2013

(54) SEMICONDUCTOR DEVICE HAVING BIT LINES AND LOCAL I/O LINES

(75) Inventors: Shingo Mitsubori, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 29 days.

(21) Appl. No.: 13/246,458

(22) Filed: Sep. 27, 2011

(65) Prior Publication Data

US 2012/0120705 A1   May 17, 2012

(30) Foreign Application Priority Data

Nov. 11, 2010   (JP) .................................. 2010-252676

(51) Int. Cl.
*G11C 5/06* (2006.01)

(52) U.S. Cl.
USPC ........................................... 365/72; 365/201

(58) Field of Classification Search .................... 365/72, 365/201

See application file for complete search history.

(56) References Cited

U.S. PATENT DOCUMENTS

| | | | | |
|---|---|---|---|---|
| 6,137,044 A | * | 10/2000 | Guilmette et al. | 84/603 |
| 6,172,918 B1 | * | 1/2001 | Hidaka | 365/189.11 |
| 6,436,725 B2 | * | 8/2002 | Sakata | 438/14 |
| 7,461,167 B1 | * | 12/2008 | Park | 709/240 |
| 2007/0233959 A1 | * | 10/2007 | Hotta et al. | 711/120 |

FOREIGN PATENT DOCUMENTS

JP   10-313101   11/1998

* cited by examiner

*Primary Examiner* — Michael Tran
(74) *Attorney, Agent, or Firm* — Morrison & Foerster LLP

(57) ABSTRACT

The present invention efficiently decides line failure and contact failure in a semiconductor device. The semiconductor device has a plurality of bit line groups in which connection with local I/O lines is controlled by the same column selection signal line. A failure detecting circuit compares a first data group read from a first bit line group and a second data group read from a second bit line group to detect whether or not connection failure (contact failure) with the column selection signal line occurs in one of the first and second bit line groups.

20 Claims, 13 Drawing Sheets

| XOR | AND | OR |
|---|---|---|
| 0 | | |
| 0 | 0 | 0 |
| 0 | | |
| 0 | | |

FIG.7

| XOR | AND | OR |
|-----|-----|-----|
| 0   |     |     |
| 1   | 0   | 1   |
| 0   |     |     |
| 0   |     |     |

FIG.8

| XOR | AND | OR |
|-----|-----|-----|
| 1 | | |
| 1 | 1 | 1 |
| 1 | | |
| 1 | | |

FIG.9

SEMICONDUCTOR DEVICE HAVING BIT LINES AND LOCAL I/O LINES

BACKGROUND OF THE INVENTION

1. Field of the Invention

The present invention relates to a semiconductor device and, more particularly, relates to a semiconductor device which has a function of testing a connection state of signal lines.

2. Description of Related Art

A DRAM (Dynamic Random Access Memory) stores data by means of charges held in memory cells. Bit lines are connected to memory cells when a word line is activated. When the bit lines and local I/O lines are connected through column switches, data can be read and written through the local I/O lines. Connection of the bit lines and local I/O lines is controlled by a column selection signal supplied via column selection signal lines. The bit lines are classified into some groups (hereinafter, "bit line groups"). A different column selection signal line and column selection signal are allocated per bit line group (see Japanese Patent Application Laid-Open No. 10-313101).

When a bit line or a memory cell have failure (hereinafter, simply "line failure"), an access to this memory is replaced with an access to a preliminary memory cell which is referred to as a "redundant cell". By contrast with this, when a connection between a column selection signal line and a bit line group has failure (hereinafter, "contact failure"), all bit lines (a plurality of bit lines associated with one column selection signal line) included in this bit line group cannot be utilized. For example, with a structure of a plurality of switches (a plurality of transistors) which connect a plurality of local I/O lines associated with a plurality of bit lines according to one column selection signal, column selection signal lines (wiring layer) are electrically connected to gate electrodes (gate electrode layer) of a plurality of transistors through contact holes (via layers). When electrical failure occurs that a conduction resistance of these contact holes becomes high, contact failure occurs. Also in this case, by replacing an access to all corresponding memory cells with an access to redundant cells, it is possible to save a bad address group.

However, even when a column selection signal line in which contact failure occurs is invalidated (not used), a bit line group (a plurality of nodes of a plurality of gate electrodes) of a replacement target is likely to accidentally connect with local I/O lines due to, for example, floating charges. Meanwhile, a sense amplifier of the bit line group of a replacement target is activated, and amplifies and holds some indefinite data. This accidental connection may cause an error operation. Hence, when contact failure occurs, it is better to discard products instead of forcedly recovering contact failure using redundant cells. Then, it is necessary to efficiently discriminate line failure and contact failure upon test of semiconductor devices.

SUMMARY

In one embodiment, there is provided a semiconductor device comprising: a selection signal line supplied with a selection signal; a plurality of first and second local I/O lines; a plurality of first and second bit lines; a plurality of first transistors each having a control electrode, each of the first transistors being coupled between an associated one of the first local I/O lines and an associated one of the first bit lines; a plurality of second transistors each having a control electrode, each of the second transistors being coupled between an associated one of the second local I/O lines and an associated one of the second bit lines; a first via conductor coupled between the selection signal line and the control electrodes of the first transistors; a second via conductor coupled between the selection signal line and the control electrodes of the second transistors; and a failure detecting circuit that detects a defect of at least one of the first and second via conductors by comparing a plurality of first data on the first local I/O lines read from the first bit lines and a plurality of second data on the second local I/O lines read from the second bit lines.

The present invention facilitates efficient discrimination of line failure and contact failure in semiconductor devices.

BRIEF DESCRIPTION OF THE DRAWINGS

The above and other features and advantages of the present invention will be more apparent from the following description of certain preferred embodiments taken in conjunction with the accompanying drawings, in which:

FIG. 7 is a truth table showing an output of a failure detecting circuit upon a normal operation;

FIG. 8 is a truth table showing an output of a failure detecting circuit upon line failure;

FIG. 9 is a truth table showing an output of a failure detecting circuit upon contact failure;

DETAILED DESCRIPTION OF THE EMBODIMENTS

Preferred embodiments of the present invention will be explained below in detail with reference to the accompanying drawings. In addition, in this specification, electrical conduction is referred to as "on" and non-electrical conduction is referred to as "off".

[Concept]

Figure 1:
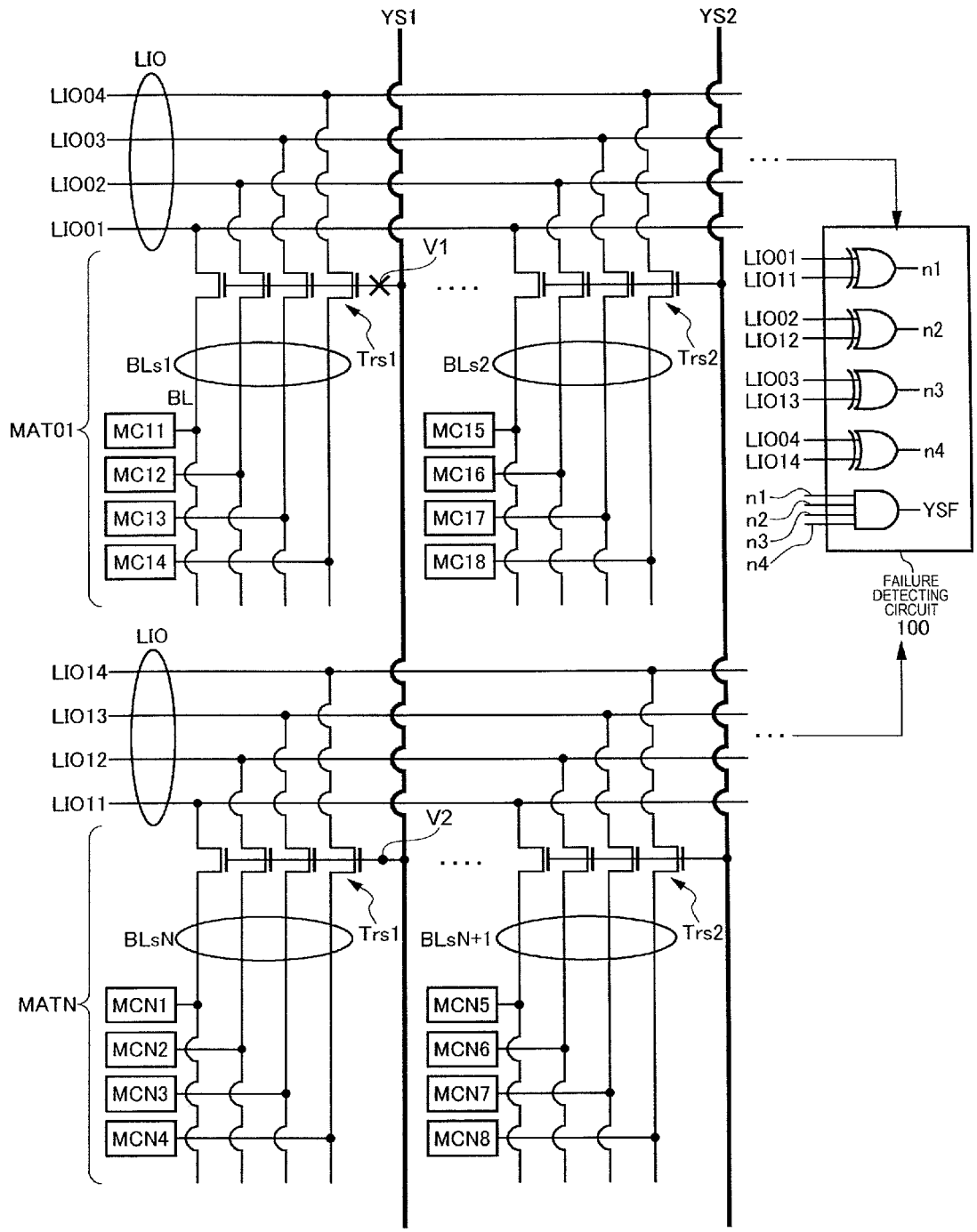
FIG. 1 is a logical schematic view for describing a technical idea of the present invention.

FIG. 1 is a logical schematic view for describing a technical idea of the present invention. In a semiconductor device 10 such as a DRAM, memory cells MC and bit lines BL are connected. The bit lines BL are connected with local I/O lines LIO through transistors Trs forming column switches. A conductive state of the transistors Trs is controlled by column selection signals supplied from the column selection signal lines YS. When the transistors Tr are placed in the on state, the bit lines BL and local I/O lines LIO are connected, thereby enabling an access (reading and writing of data) to memory cells MC from an internal circuit (not illustrated) added to LIO. A plurality of memory cells MC are associated with a plurality of bit lines BL, a plurality of transistors Trs and a plurality of local I/O lines LIO. A plurality of transistors Trs1 are controlled by a first column selection signal supplied from one column selection signal line YS1. A plurality of transistors Trs2 are controlled by a second column selection signal supplied from a column selection signal line YS2. A plurality of memory cells MC and a plurality of bit lines BL associated with a plurality of transistors Trs1 are a first bit line group. A plurality of memory cells MC and a plurality of bit lines BL associated with a plurality of transistors Trs2 are a second bit line group. A plurality of memory cells MC, a plurality of bit lines BL and a plurality of transistors Trs associated with the first and second bit line groups are included in a memory mat MAT01. The same also applies to a memory mat MATN. The first and Nth bit line groups are associated with the first column selection signal line YS1. Similarly, the second and N+1th bit line groups are associated with the second column selection signal line YS2. A plurality of local I/O lines LIO (LIO01 to 04) are common between the first and second bit line groups. Similarly, a plurality of local I/O lines LIO (LIO11 to 14) are common between the Nth and N+1th bit line groups. A failure detecting circuit 100 is added to a plurality of local I/O lines LIO. The failure detecting circuit 100 has four XOR circuits and one AND circuit. The first XOR circuit decides match or mismatch between a signal of the local I/O line LIO01 associated with the memory mat MAT01 and a signal of the local I/O line LIO11 associated with the memory mat MATN. Similarly, the second XOR circuit receives a signal of the local I/O line LIO02 associated with the memory mat MAT01 and a signal of the local I/O line LIO12 associated with the memory mat MATN, the third XOR circuit receives a signal of the local I/O line LIO03 associated with the memory mat MAT01 and a signal of the local I/O line LIO13 associated with the memory mat MATN, and the fourth XOR circuit receives a signal of the local I/O line LIO04 associated with the memory mat MAT01 and a signal of the local I/O line LIO14 associated with the memory mat MATN. Outputs of the four XOR circuits are supplied to the AND circuit. When all outputs of the four XOR circuits mismatch, the AND circuit outputs "1" as the output of the failure detecting circuit 100.

The bit lines BL are classified into a plurality of bit line groups BLs (BLs1, BLs2, BLs and BLsN+1). The column selection signal line YS is allocated per bit line group BLs. A column selection signal line YS1 (first selection signal line) is allocated to the bit line groups BLs1 and BLsN, and a column selection signal line YS2 (second selection signal line) is allocated to the bit line groups BLs2 and BLsN+1. The four bit lines BL are each associated with the four memory cells MC.

The transistor group Trs1 which connects the bit line groups BLs1 and BLsN and local I/O lines LIO (LIO01 to 04 and 11 to 14) associated with the bit line groups BLs1 and BLsN is controlled by a column selection signal (first selection signal) supplied from the column selection signal line YS1. Similarly, the transistor group Trs2 which connects the bit line groups BLs2 and BLsN+1 and local I/O lines LIO (LIO01 to 04 and 11 to 14) associated with the bit line groups BLs2 and BLsN+1 is controlled by a column selection signal (second selection signal) supplied from the column selection signal line YS2.

Upon a normal operation, when the column selection signal line YS1 is selected and the bit line group BLs1 is connected with the local I/O lines LIO (LIO01 to 04), the other column selection lines YS (corresponding to YS2 in FIG. 1) are not selected. In this case, an access can be made to the memory cells MC (MC11 to 14) associated with the bit line group BLs1. Further, the bit line group BLsN is also connected with the local I/O lines LIO (LIO11 to 14). In addition to the memory cells MC (MC11 to 14), an access can be also made to the memory cells MC (MCN1 to N4) associated with the bit line group BLsN. Similarly, when the column selection signal line YS2 is selected, the other column selection lines YS than the column section signal line YS2 are not selected. In addition, an access is simultaneously made to the memory mat MAT01 and memory mat MATN through word lines (see FIG. 3) associated with the memory mat MAT01 and memory mat MATN, respectively.

It is assumed that connection failure of the via conductor V1 coupled between the selection signal line Y1 and the gate electrodes of the transistor group Trs1, that is, contact failure (indicated by symbol x in FIG. 1), occurs. It is also assumed that connection failure of the via conductor V2 coupled between the selection signal line Y1 and the gate electrodes of the transistor group Trs2 does not occur. The via conductors V1 and V2 are provided so as to penetrate the interlayer insulating film. In this case, an access cannot be made to all memory cells belonging to the bit line group BLs1. By replacing an access to the four memory cells MC associated with the bit line group BLs1 with an access to four corresponding redundant cells (not illustrated), and then invalidating the column selection signal line YS1, it is possible to save an address.

However, even when the column selection signal line YS1 is invalidated using a known redundancy technique (even when a corresponding transistor is controlled to be non-conductive by making the logic of the column selection signal line YS1 low), the transistor group Trs1 is likely to be accidentally placed in the on (conductive) state due to, for example, floating charges. The gate electrodes of a plurality of transistors forming the transistor group Trs1 are electrically connected with the column selection signal line YS1 through contact holes (via layers). When electrical failure occurs that a conduction resistance of these contact holes becomes high, contact failure occurs. Hence, these gate electrodes are placed in a floating state, and are likely to be accidentally placed in the on (conductive) state. When inaccessible memory cells MC (MC11 to 14) are connected with the local I/O lines LIO, the semiconductor device 10 is likely to make an error operation. Data of redundant memory cells associated with the local I/O lines LIO (LIO11 to 14) is also likely to cause bus fight on the local I/O lines LIO (LIO01 to 04). Hence, it is better to discard the semiconductor device 10 in which contact failure occurs, instead of performing address saving processing.

Hence, with the present invention, after information of the same content is written in the memory cells MC (MC11 to 14) associated with the bit line group BLs1 and memory cells (MCN1 to N4) associated with the bit line group BLsN as part of test process, reading processing of these memory cells MC (MC11 to 14 and N1 to N4) is executed. The failure detecting circuit 100 compares a set (first data group) of data read from the bit line group BLs1 and a set (second data group) of data read from the bit line group BLsN, and decides that contact failure occurs when both of the sets completely mismatch. More specifically, when the signal of the local I/O line LIO01 and the signal of the local I/O line LIO11 mismatch, the signal of the local I/O line LIO02 and the signal of the local I/O line LIO12 mismatch, the signal of the local I/O line LIO03 and the signal of the local I/O line LIO13 mismatch, and the signal the local I/O line LIO04 and the signal of the local I/O line LIO14 mismatch, it is decided that the contact failure occurs.

Hereinafter, a specific configuration and control of the semiconductor device 10 will be described based on an embodiment.

Embodiment

Figure 2:
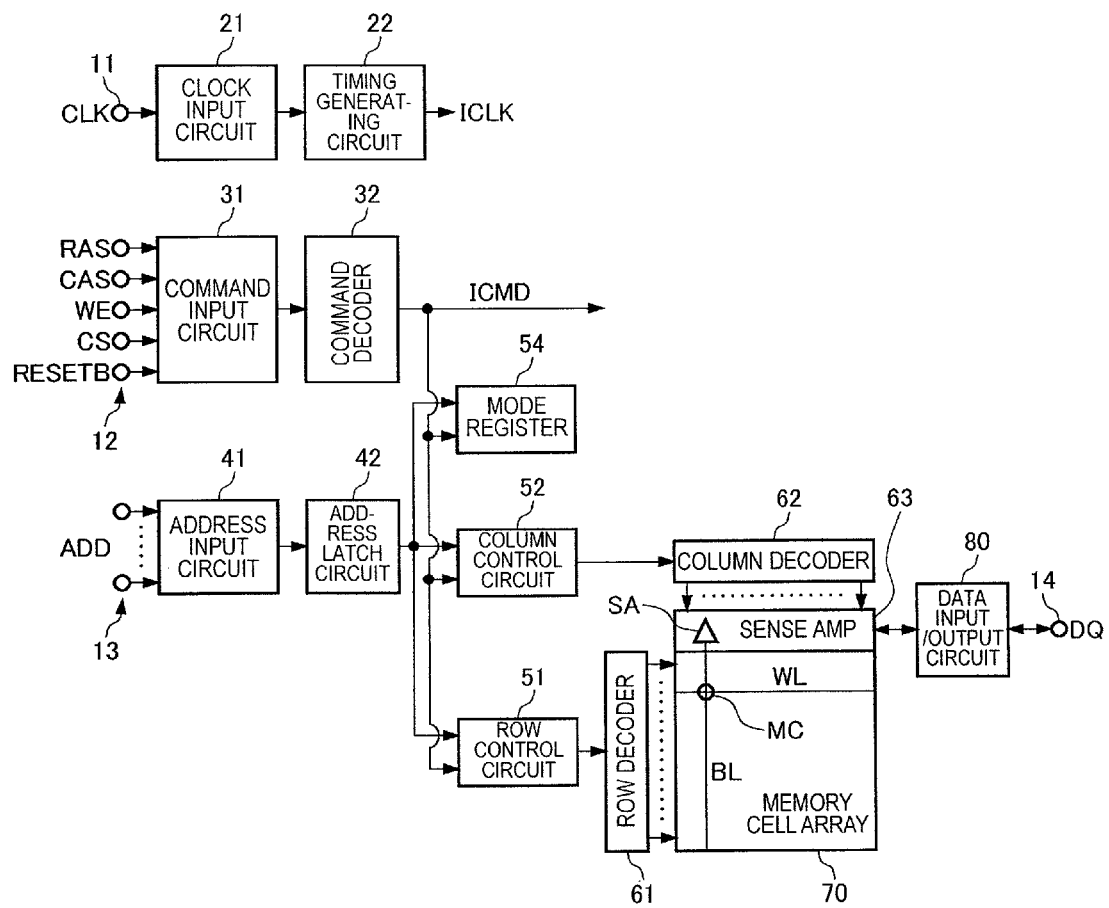
FIG. 2 is a functional block diagram of the semiconductor device.

FIG. 2 is a functional block diagram of the semiconductor device 10. The semiconductor device 10 according to the present embodiment is a DDR (Double-Data-Rate) type SDRAM (Synchronous Dynamic Random Access Memory), and has a clock terminal 11, a command terminal 12, an address terminal 13 and a data input/output terminal 14 as external terminals. In addition, although a data strobe terminal and calibration terminal are also provided, these are not illustrated in figures.

The clock terminal 11 receives a clock signal CLK, and the supplied clock signal CLK is supplied to the clock input circuit 21. The output of the clock input circuit 21 is supplied to a timing generating circuit 22. The timing generating circuit 22 generates an internal clock ICLK to supply to various internal circuits which will be described below.

The command terminal 12 receives command signals such as a row address strobe signal RAS, a column address strobe signal CAS, a write enable signal WE, a chip select signal CS and a reset bar signal RESETB. These command signals are supplied to a command input circuit 31. These command signals supplied to the command input circuit 31 are supplied to a command decoder 32. The command decoder 32 generates various internal commands ICMD by holding, decoding and counting the command signals in synchronization with the internal clock ICLK. The generated internal command ICMD is supplied to, for example, a row control circuit 51, a column control circuit 52 and a mode register 54. The command decoder 32 further generates a test activation signal (not illustrated in FIG. 2) to supply to a row decoder 61, a column decoder 62 and a failure detecting circuit 100. The test activation signal is a test signal for implementing a test according to the present invention. The test activation signal may be activated in a test mode which will be described below.

The mode register 54 is a register for setting an operation mode of the semiconductor device 10. For example, according to a mode signal set in the mode register 54, the latency or clock frequency is defined upon a normal operation. Further, according to the mode signal set in the mode register 54, the semiconductor device 10 can also enter a test mode for controlling the failure detecting circuit 100.

The address terminal 13 receives address signals ADD, and the supplied address signals ADD are supplied to an address input circuit 41. The outputs of the address input circuit 41 are supplied to an address latch circuit 42. The address latch circuit 42 latches the address signals ADD in synchronization with the internal clock ICLK. Of the latched address signals ADD, a row address is supplied to the row control circuit 51, and a column address is supplied to the column control circuit 52. Further, upon an entry in the mode register set, the address signals ADD are supplied to the mode register 54.

The output of the row control circuit 51 is supplied to a row decoder 61. The row decoder 61 selects one of word lines WL included in a memory cell array 70. Further, the row decoder 61 simultaneously selects the word line WL1 associated with a memory mat MAT01 and the word line WL1 associated with a memory mat MATN described later in FIG. 3, according to the test activation signal, and activates signals of these word lines WL1. In the memory cell array 70, a plurality of word lines WL and a plurality of bit lines BL intersect, and, at their intersections, memory cells MC are arranged (in FIG. 2, only one word line WL, one bit line BL and one memory cell MC are illustrated). The bit lines BL are each connected to one of sense amplifiers SA included in a sense circuit 63. The output of the column control circuit 52 is supplied to the column decoder 62. The column decoder 62 generates a column selection signal for selecting one of the bit lines BL included in the memory cell array 70. Further, the column decoder 62 simultaneously selects a column selection signal line YS01 associated with the memory mat MAT01 described below in FIG. 3 and a column selection signal line YS11 associated with the memory mat MATN, according to the test activation signal, and activates signals of these column section signal lines.

The column decoder 62 selects one of the sense amplifiers SA of the sense circuit 63, in other words, the bit line BL which is a data access target, based on the column address of the address signals ADD. The sense amplifier SA selected by the column decoder 62 is connected to a data input/output circuit 80. By this means, the memory cell MC which is an access target is connected with the data input/output terminal 14 through the data input/output circuit 80. The failure detecting circuit 100 is included in the data input/output circuit 80. The data input/output terminal 14 outputs read data DQ, receives write data DQ and outputs a YSF signal of the failure detecting circuit 100.

Figure 3:
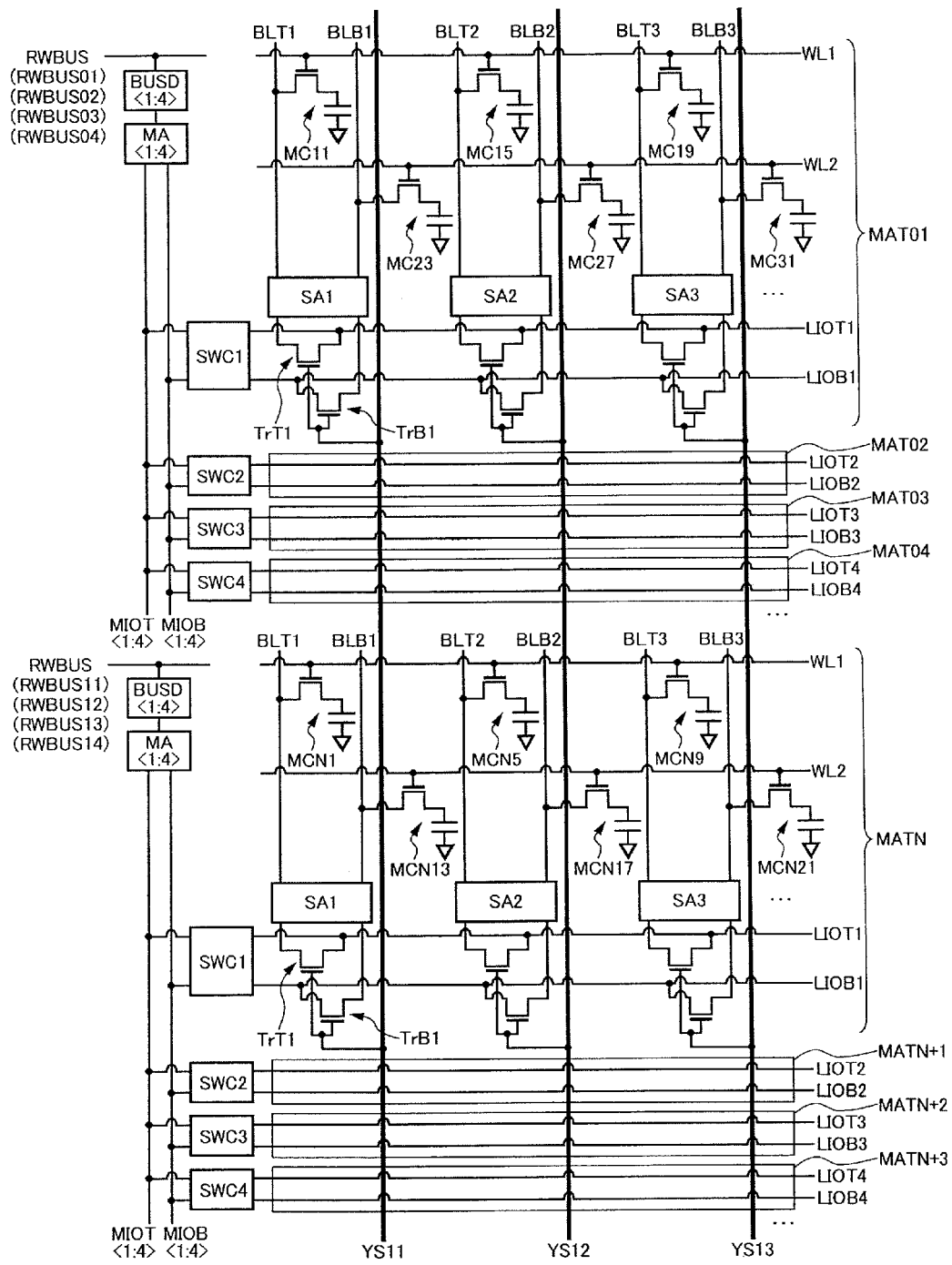
FIG. 3 is a circuit diagram schematically illustrating routes from memory cells to read/write buses.

FIG. 3 is a circuit diagram schematically illustrating routes from memory cells MC to read/write buses RWBUS. A read/write bus RWBUS01 associated with the memory mat MAT01 is connected to the data input/output circuit 80. A plurality of memory cells MC are connected to each of word lines WL1 and WL2. Of these word lines, a memory cell MC11 connected to the word line WL1 is connected with a bit line BLT1, and a memory cell MC23 connected to the word line WL2 is connected with a bit line BLB1. The signals of the bit line BLT1 and bit line BLB1 are differentially amplified by a sense amplifier SA1. When, for example, the word line WL1 is activated, the potential of the bit line BLT1 changes depending on a charge holding state of the memory cell MC1. In this case, the potential of the non-selected bit line BLB1 is a precharge potential. The sense amplifier SA1 amplifies the difference between both potentials. Similarly, a read/write bus RWBUS11 associated with the memory mat MATN is connected to the data input/output circuit 80. A plurality of memory cells MC are connected to each of the word lines WL1 and WL2. Of these word lines, a memory cell MCN1 connected to the word line WL1 is connected with the bit line BLT1, and a memory cell MCN13 connected to the word line WL2 is connected with the bit line BLB1. The signals of the bit line BLT1 and bit line BLB1 are differentially amplified by the sense amplifier SA1. When, for example, the word line WL1 is activated, the potential of the bit line BLT1 changes depending on a charge holding state of the memory cell MC1. In this case, the potential of the non-selected bit line BLB1 is a precharge potential. The sense amplifier SA1 amplifies the difference between both potentials.

The bit line BLT1 is connected with a local I/O line LIOT1 through a transistor TrT1, and the bit line BLB1 is connected with a local I/O line LIOB1 through a transistor TrB1. Electrical conductive states of transistors TrT1 and TrB2 associated with the memory mat MAT01 are controlled according to a column selection signal supplied from a column selection signal line YS11. Electrical conductive states of the transistors TrT1 and TrB2 associated with the memory mat MATN are controlled according to a column selection signal supplied from the column selection signal line YS11. The local I/O line LIOT1 associated with the memory mat MAT01 corresponds to a local I/O line LIO01 illustrated in FIG. 1. Similarly, the local I/O line LIOT1 associated with the memory mat MATN corresponds to a local I/O line LIO11 illustrated in FIG. 1. Local I/O lines LIO02 to 04 and local I/O lines LIO12 to 14 illustrated in FIG. 1 are not illustrated in FIG. 3 for convenience of the drawings.

As described below, although, with the present embodiment, the two column selection signal lines YS01 and YS11 associated with the memory mat MAT01 and memory mat MATN control electrical connection of sixteen (eight pairs of) bit lines BL and a plurality of local I/O lines LIO associated each of the bit lines BL, FIG. 3 focuses for ease of description upon the relationship between the column selection signal lines YS01 and four (two pairs of) bit lines BLT1 and BLT2 associated with YS01 and the column selection signal lines YS11 and the four (two pairs of) bit lines BLT1 and BLT2 associated with YS11.

A pair of local I/O lines LIOT1 and LIOB1 are further connected with main I/O lines MIOT and MIOB through a switch circuit SWC1. A plurality of pairs of local I/O lines LIO each associated with memory mats MAT01 to 03 are each connected with a pair of main I/O lines MIO through a switch circuits SWC. One of the memory mats MAT01 to 03 is activated. Only one of a plurality of switch circuits SWC is activated simultaneously, so that potentials of a pair of local I/O lines LIO of a plurality of pairs of local I/O lines LIO are supplied to the main I/O lines MIOT and MIOB. The same also applies to a plurality of pairs of local I/O lines LIO, a plurality of switch circuits SWC and a pair of main I/O lines MIO associated with the memory mat MATN to memory mat MATN+3.

A plurality of potentials appearing in a plurality of main I/O lines MIO associated with the memory mats MAT01 and MATN are connected with a plurality of read/write buses RWBUS (RWBUS01 and RWBUS11) through a main amplifier MA and a bus driver circuit BUSD. That is, by selecting a plurality of word lines WL1, a plurality of column selection signal lines YS01 and YS11 and a plurality of switch circuits SWC1 associated with the memory mats MAT01 and MATN, it is possible to connect the read/write bus RWBUS01 associated with the memory mat MAT01 with the memory cell MC11 of interest, and the read/write bus RWBUS11 associated with MATN with the memory cell MCN1 of interest. Further, the signal of the read/write bus RWBUS01 and signal of the read/write bus RWBUS11 are supplied to the first XOR circuit (FIG. 1). A signal of a read/write bus RWBUS02 (not illustrated) associated with a memory cell MC12 and a signal of a read/write bus RWBUS12 (not illustrated) associated with a memory cell MCN2 are supplied to the second XOR circuit (FIG. 1). A signal of a read/write bus RWBUS03 (not illustrated) associated with a memory cell MC13 and a signal of a read/write bus RWBUS13 (not illustrated) associated with a memory cell MCN3 are supplied to the third XOR circuit (FIG. 1). A signal of a read/write bus RWBUS04 (not illustrated) associated with a memory cell MC14 and a signal of a read/write bus RWBUS14 (not illustrated) associated with a memory cell MCN4 are supplied to the fourth XOR circuit (FIG. 1). In addition, a plurality of local I/O lines LIO01 to 04 illustrated in FIG. 1 are replaced with the read/write bus RWBUS01 illustrated in FIG. 4 and read/write buses RWBUS02 to 04 (not illustrated). Similarly, a plurality of local I/O lines LIO11 to 14 illustrated in FIG. 1 are replaced with the read/write bus RWBUS11 illustrated in FIG. 4 and read/write buses RWBUS12 to 14 (not illustrated).

Figure 4:
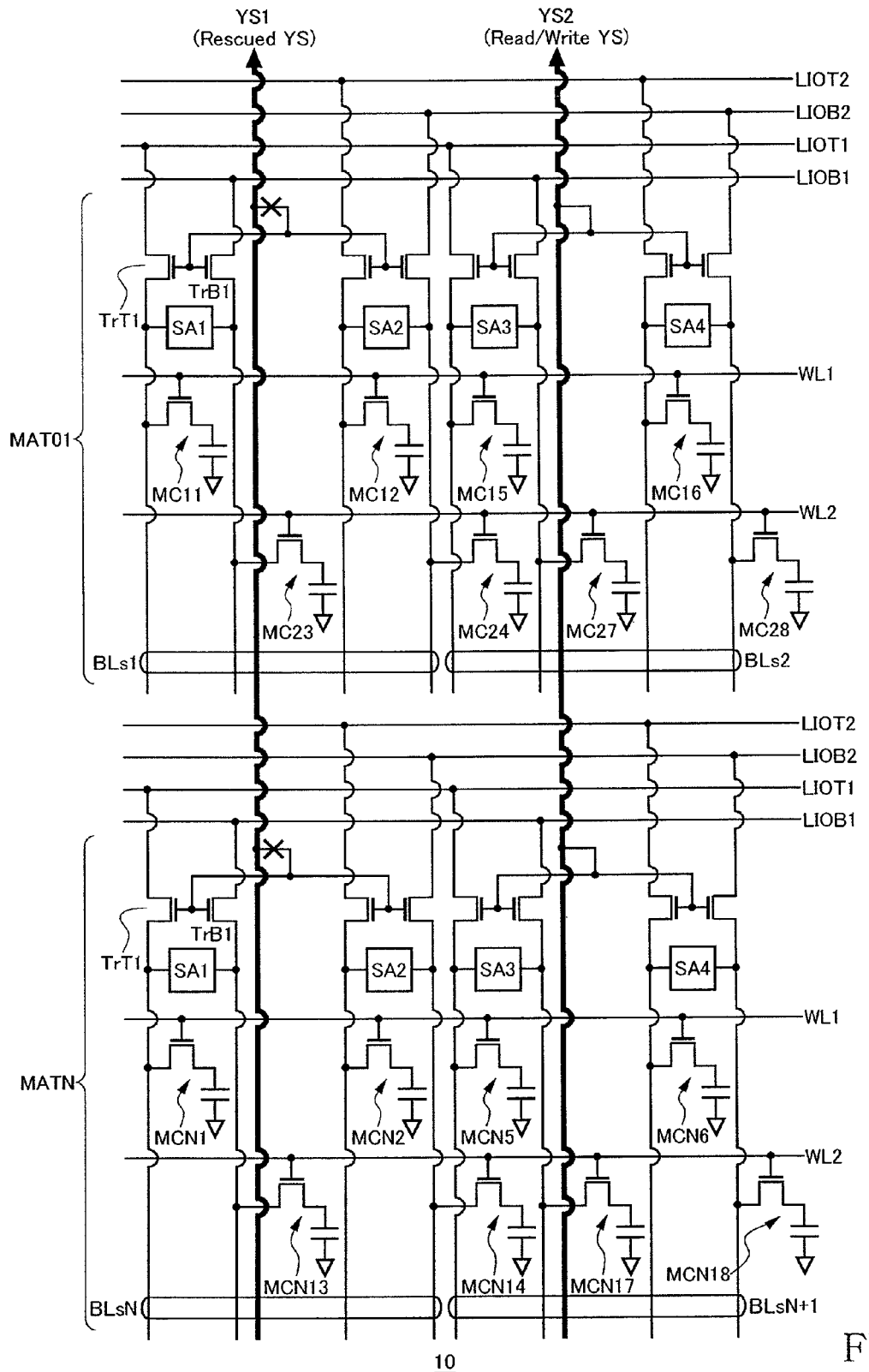
FIG. 4 is a circuit diagram illustrating in detail the relationship between the bit lines and local I/O lines.

FIG. 4 is a circuit diagram illustrating in detail the relationship between the bit lines BL and local I/O lines LIO associated with the memory mat MAT01 and memory mat MATN. In addition, for convenience of the drawing, FIG. 4 does not illustrate the memory cell MC13, memory cell MC14, memory cell MC17, memory cell MC18, memory cell MCN3, memory cell MCN4, memory cell MCN7, memory cell MCN8, a plurality of bit lines and local I/O lines (LIO03, LIO04, LIO13 and LIO14) associated with these memory cells illustrated in FIG. 1. As illustrated in FIG. 4, a bit line group BLs1 associated with the memory mat MAT01 is controlled according to the column selection signal line YS1, and a bit line group BLs2 is controlled according to a column selection signal line YS2. As illustrated in FIG. 4, each bit line group includes four bit lines BL. The bit line group BLs1 is connected with memory cells MC11, MC12, MC23 and MC24, and the bit line group BLs2 is connected with memory cells MC15, MC16, MC27 and MC28. Similarly, the bit line group BLsN associated with the memory mat MATN is controlled according to the column selection signal line YS1, and the bit line group BLsN+1 is controlled according to the column selection signal line YS2. Each bit line group includes four bit lines BL. A bit line group BLsN is connected with memory cells MCN1, MCN2, MCN13 and MCN14, and bit line group BLsN+1 is connected with the memory cells MCN5, MCN6, MCN17 and MCN18.

The column selection signal lines YS and bit lines BL are formed in different layers. Hence, the gate electrodes of transistors (column switches) provided for the bit lines BL and column selection signal lines YS are connected through penetration electrodes (vias) penetrating between layers. Connection failure of these penetration electrodes is "contact failure". Assume that contact failure occurs between the column selection signal line YS1 and bit line BLs1. In this case, the bit line group BLs1 is out of control, and therefore the memory cells MC11 to MC14 cannot be used. However, even if the column selection signal line YS1 is invalidated, wirings of the column selection signal line YS1, bit line group Bs1, memory cells MC11 to MC14 and the gate electrodes of the four transistors (column switches) associated with these wirings are left on a substrate, and therefore there is a concern that memory cells MC are accidentally connected to local I/O lines LIO due to, for example, noise.

Figure 5:
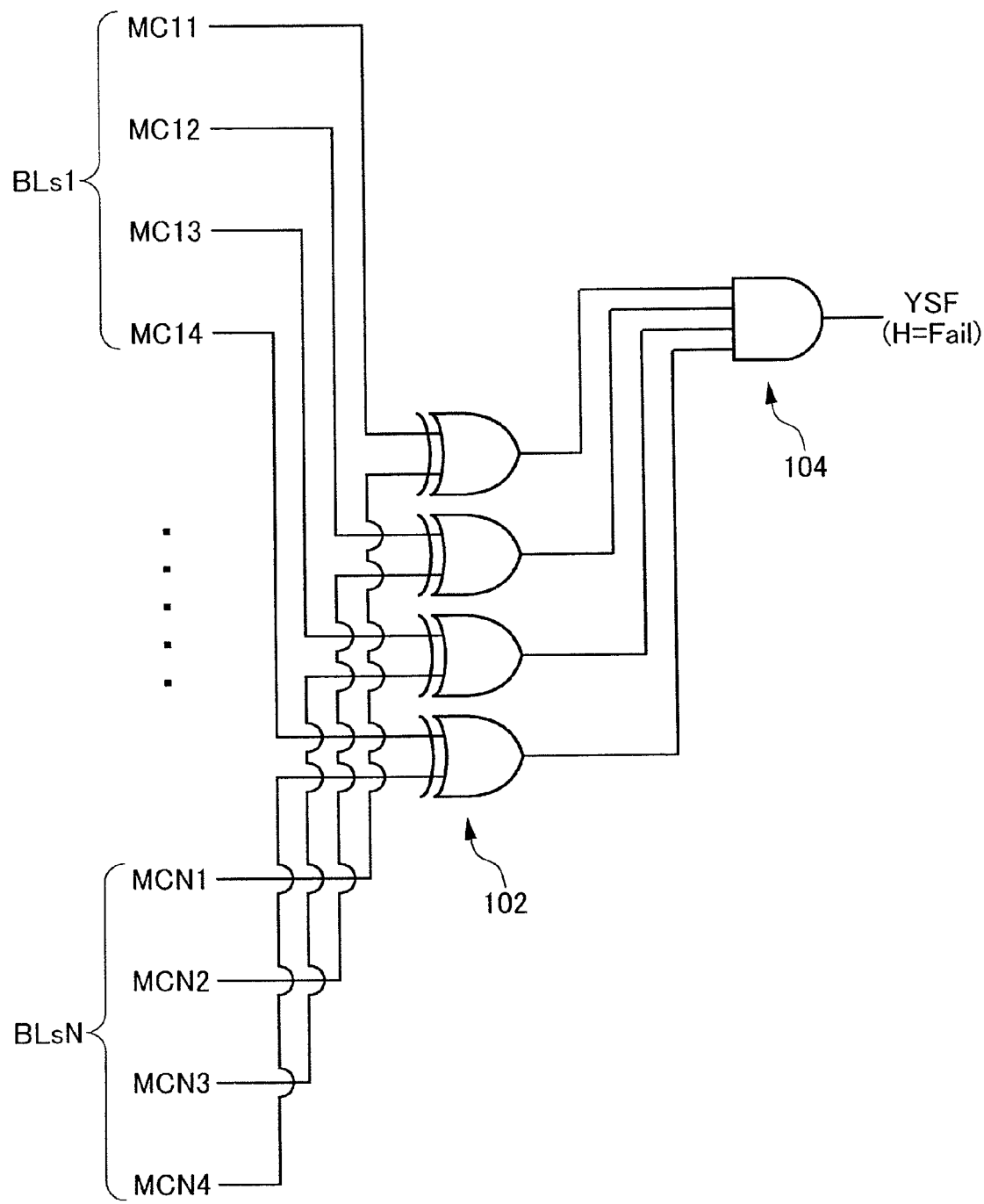
FIG. 5 is a circuit diagram of a failure detecting circuit according to a first example.

FIG. 5 is a circuit diagram of a failure detecting circuit 100a according to a first example of the present embodiment. The failure detecting circuit 100a according to the first example detects contact failure by comparing data of a plurality of memory cells MC. First, outputs of the four memory cells MC11 to MC14 included in the bit line group BLs1 are inputted to one input terminal of the first comparing circuit 102. Also, outputs of the four memory cells MCN1 to MCN4 included in the bit line group BLsN are inputted to the other input terminal of the first comparing circuit 102. More specifically, the first comparing circuit 102 includes four XOR circuits. Although, actually, there are, for example, the local I/O lines LIO and main amplifiers MA on routes from the memory cells MC to the first comparing circuit 102, these inclusions are not illustrated in FIG. 5 for ease of illustration. The same also applies to FIGS. 6, 10 and 11.

The four XOR circuits each compare outputs of the memory cell MC11 and memory cell MCN1, the memory cell MC12 and memory cell MCN2, the memory cell MC13 and memory cell MCN3, and the memory cell MC14 and memory cell MCN4. Further, "1" is outputted in case of mismatch, and "0" is outputted in case of match. The output of the first comparing circuit 102 is an input of a second comparing circuit 104. More specifically, the second comparing circuit 104 includes one AND circuit.

Figure 7:
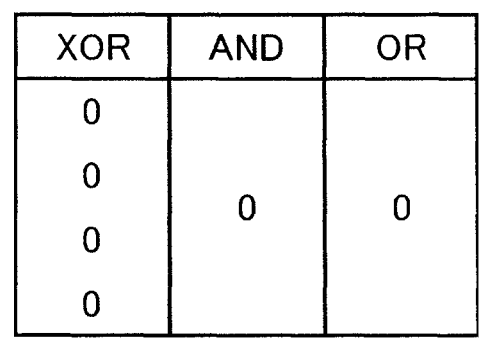

First, information of the same content, for example, "1", is written in advance in the memory cells MC11 to MC14 and MCN1 to MCN4. Next, the failure detecting circuit 100a performs pair comparison of data read from the memory cells MC11 to MC14 and MCN1 to MCN4 in the first comparing circuit 102. If there is no failure in particular, all XOR circuits included in the first comparing circuit 102 output "0 (match)", and therefore a binary first decision signal YSF outputted from the second comparing circuit 104 is "0" indicating that "there is no contact failure" (see FIG. 7).

Figure 8:
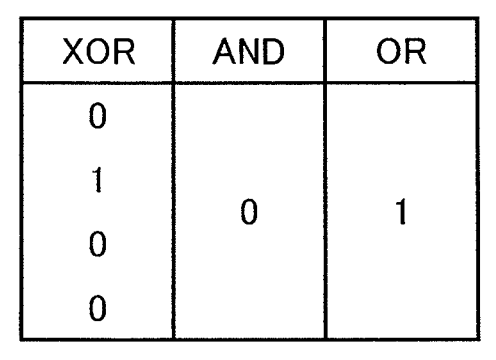
Figure 9:
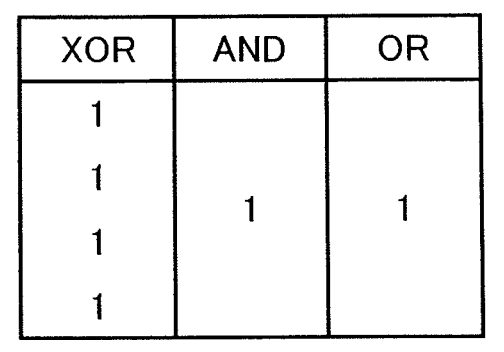

In case of line failure which is failure in bit lines or memory cells, although one of the XOR circuits included in the first comparison circuit 102 outputs "1 (mismatch)", the first decision signal YSF outputted from the second comparing circuit 104 is also "0" indicating that "there is no contact failure" (see FIG. 8). That is for the comparison logic (decision logic) of the second comparing circuit 104 is AND. By contrast with this, when contact failure occurs which is failure at a connection of a column selection signal line and bit line group in the bit line group BLs1, all outputs of the memory cells MC11 to MC14 become indefinite. Meanwhile "indefinite" means outputting a fixed value irrespectively of written data, and, for example, means that all signals are "0". As a result, all four XOR circuits of the first comparing circuit 102 output "1 (mismatch)", and the first decision signal YSF of the second comparing circuit 104 is "1" indicating that "there is contact failure" (see FIG. 9). By changing data to be written into memory cells, all four XOR circuits of the first comparing circuit 102 output "1 (mismatch)", so that it is possible to detect contact failure. Line failure is recovered by means of redundant cells, and then, without recovering contact failure, chips (semiconductor devices) are discarded.

In case of this scheme, if contact failure occurs in both of the bit line group BLs1 and bit line group BLsN, it is not possible to detect contact failure. However, the likelihood that contact failure occurs is much lower than the likelihood that line failure occurs, so that the likelihood that contact failure occurs in both of the two bit line groups BLs of comparison targets is next to zero. Consequently, it is possible to efficiently detect contact failure by comparing data of two bit line groups BLs.

Figure 6:
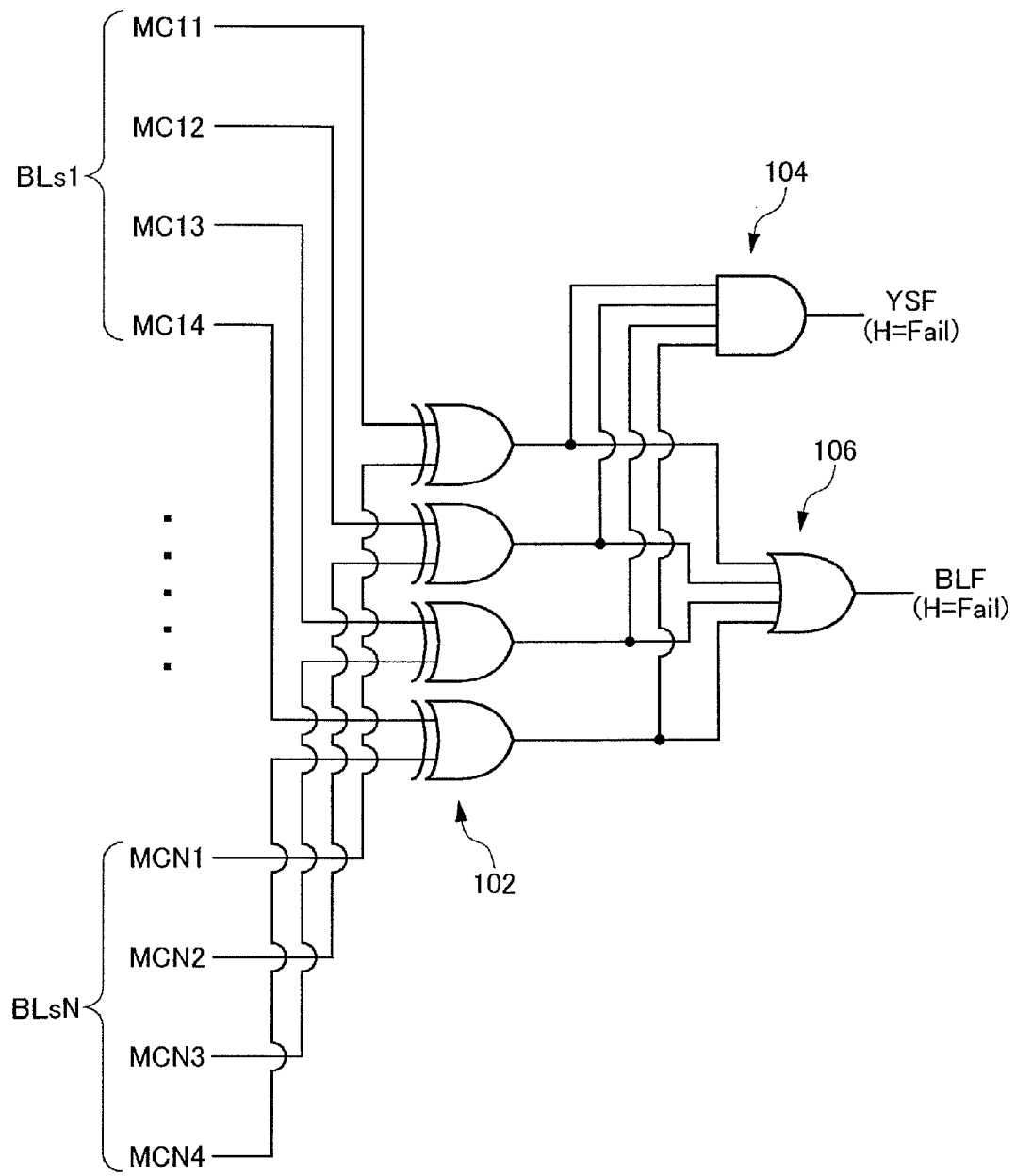
FIG. 6 is a circuit diagram of a failure detecting circuit according to a second example.

FIG. 6 is a circuit diagram of a failure detecting circuit 100b according to a second example of the present embodiment. With the failure detecting circuit 100b according to the second example, a third comparing circuit 106 is added to the failure detecting circuit 100a according to the first example. The failure detecting circuit 100b has a function of detecting line failure in addition to contact failure. More specifically, the third comparing circuit 106 is an OR circuit, and its output is a binary second decision signal BLF. The comparison logic (decision logic) of the third comparing circuit 106 is OR, so that, in case of line failure which is failure in bit lines or memory cells, it is possible to recover this line failure using redundant cells.

Also in case of the failure detecting circuit 100b, information of the same content, for example, "1" is first written in advance in the memory cells MC11 to MC14 and MCN1 to MCN4. Next, the failure detecting circuit 100b performs pair comparison of data read from the memory cells MC11 to MC14 and MCN1 to MCN4 in the first comparing circuit 102. If there is no failure in particular, all XOR circuits included in the first comparing circuit 102 output "0 (match)", and therefore a binary second decision signal BLF outputted from the third comparing circuit 106 is "0" indicating that "there is no line failure" (see FIG. 7).

In case of line failure, the first decision signal YSF is "0" indicating that "there is no contact failure", and the second decision signal BLF is "1" indicating that "there is line failure" (see FIG. 8). When contact failure occurs in the bit line group BLs1, the outputs of the memory cells MC11 to MC14 become indefinite irrespectively of write data. The outputs become, for example, "0". As a result, all four XOR circuits of the first comparing circuit 102 output "1", and the first decision signal YSF is "1" indicating that "there is contact failure" and the second decision signal BLF is "1" indicating that "there is line failure" (see FIG. 9).

Figure 10:
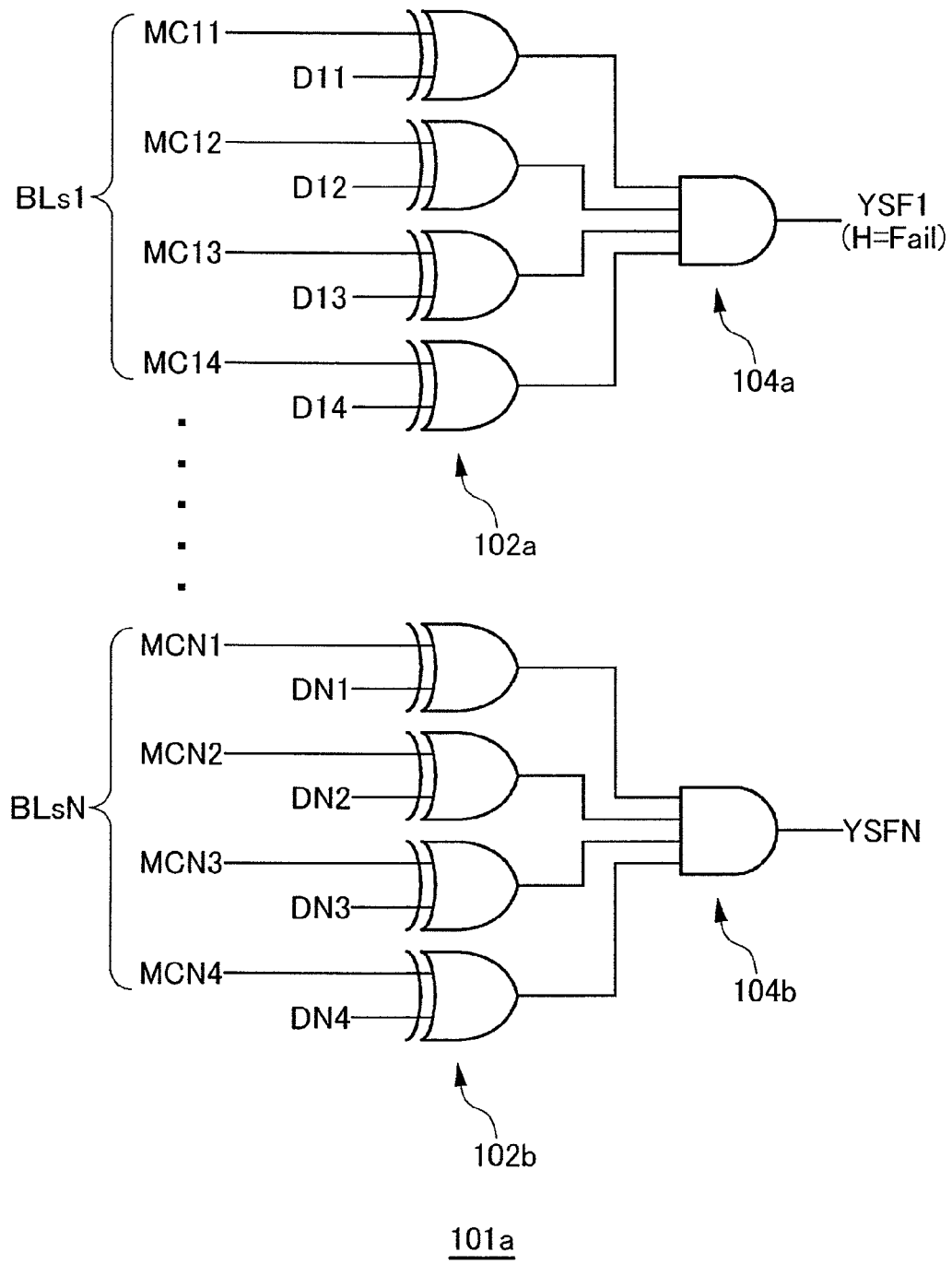
FIG. 10 is a circuit diagram of the failure detecting circuit according to a first comparison example with respect to the present embodiment.

FIG. 10 is a circuit diagram of a failure detecting circuit 101a according to a first comparison example. The failure detecting circuit 101a according to the first comparison example detects contact failure by comparing data of a plurality of memory cells MC belonging to the same bit line group BLs with data D (expected value) stored in advance. The outputs of the four memory cells MC11 to MC14 included in the bit line group BLs1 are inputted to a first comparing circuit 102a. Outputs of the four memory cells MC11 to MC14 included in another bit line group BLsN are inputted to another first comparing circuit 102b. The first comparing circuits 102a and 102b each include four XOR circuits.

The four XOR circuits of the first comparing circuit 102a each compare the output of the memory cell MC11 and data D11, the output of the memory cell MC12 and data D12, the output of the memory cell MC13 and data D13, and the output of the memory cell MC14 and data D14. Further, "1" is outputted in case of mismatch, and "0" is outputted in case of match. The output of the first comparing circuit 102a is an input of a second comparing circuit 104a. More specifically, the second comparing circuit 104a includes one AND circuit.

First, the data D11 to D14 are written in advance in the memory cells MC11 to MC14. Next, the failure detecting circuit 101a performs pair comparison of data read from the memory cells MC11 to MC14 and the data D11 to D14 in the first comparing circuit 102a. If there is no failure in particular, all XOR circuits included in the first comparing circuit 102a output "0", and therefore a binary first decision signal YSF1 outputted from the second comparing circuit 104a is "0" indicating that "there is no contact failure". Upon contact failure, writing of the data D11 to D14 in the memory cells MC11 to MC14 fails. In this case, all outputs of the four XOR circuits become "1". There are cases where all four XOR circuits output "1" depending on a combination of data to be written in memory cells, the first decision signal YSF1 is "1" indicating that "there is contact failure".

Figure 11:
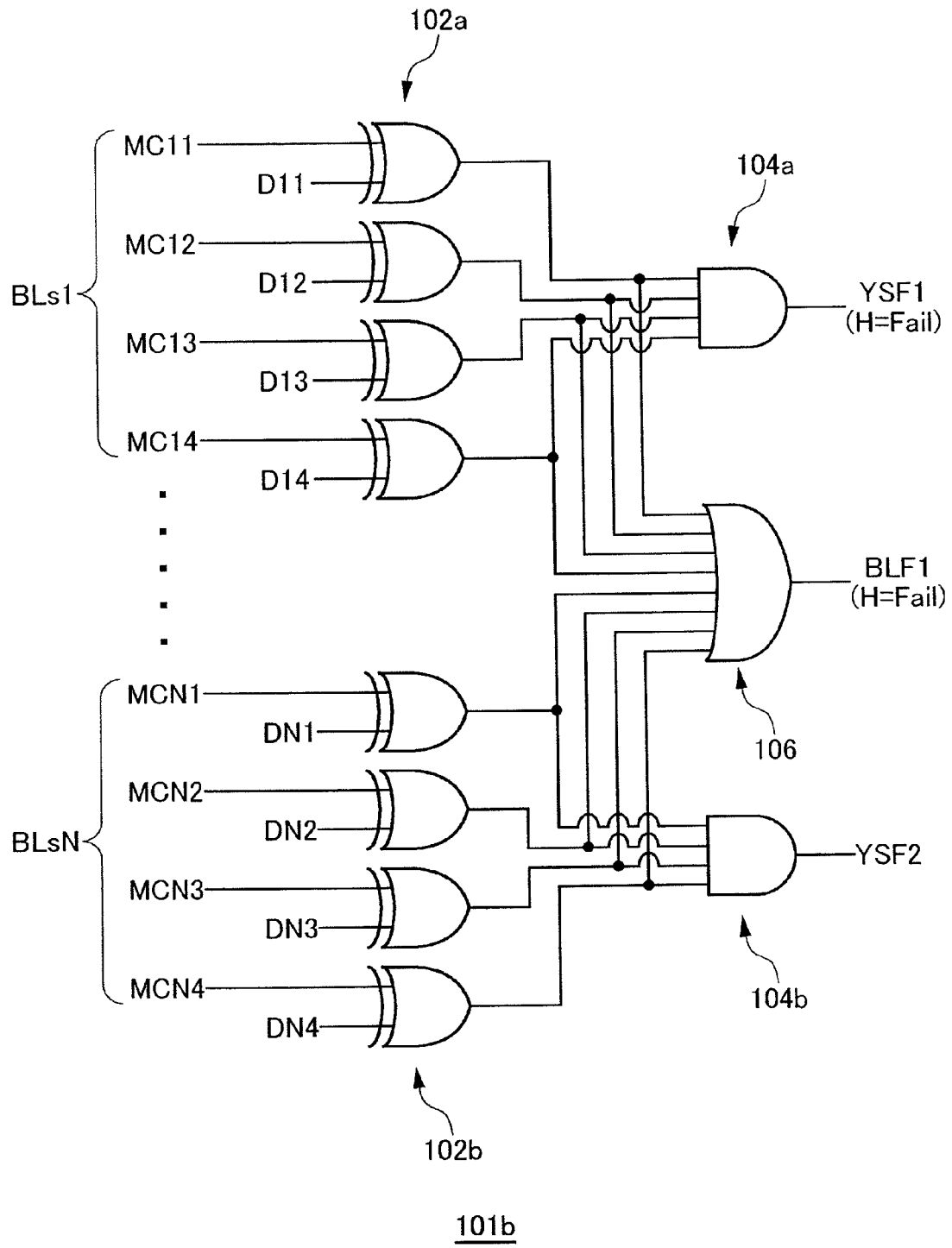
FIG. 11 is a circuit diagram of the failure detecting circuit according to a second comparison example with respect to the present embodiment.

FIG. 11 is a circuit diagram of a failure detecting circuit 101b according to a second comparison example. With the failure detecting circuit 101b according to the second example, a third comparing circuit 106 is added to the failure detecting circuit 101a according to the first comparison example. The failure detecting circuit 101b has a function of detecting line failure in addition to contact failure. More specifically, the third comparing circuit 106 is an OR circuit, and its output is the second decision signal BLF. When line failure occurs in one of the bit lines BL, one of the XOR circuits outputs "1", and therefore the second decision signal BLF is "1" indicating that "there is line failure".

In case of the first comparison example and second comparison example, the number of XOR circuits doubles compared to the first example and second example of the present embodiment. Further, it is necessary to store the data D (expected value) written in the memory cells MC, in another area for comparison. Consequently, the failure detecting circuits 100a and 100b according to the first example and second example of the present embodiment provide a superior advantage of detecting contact failure while saving a space.

Figure 12:
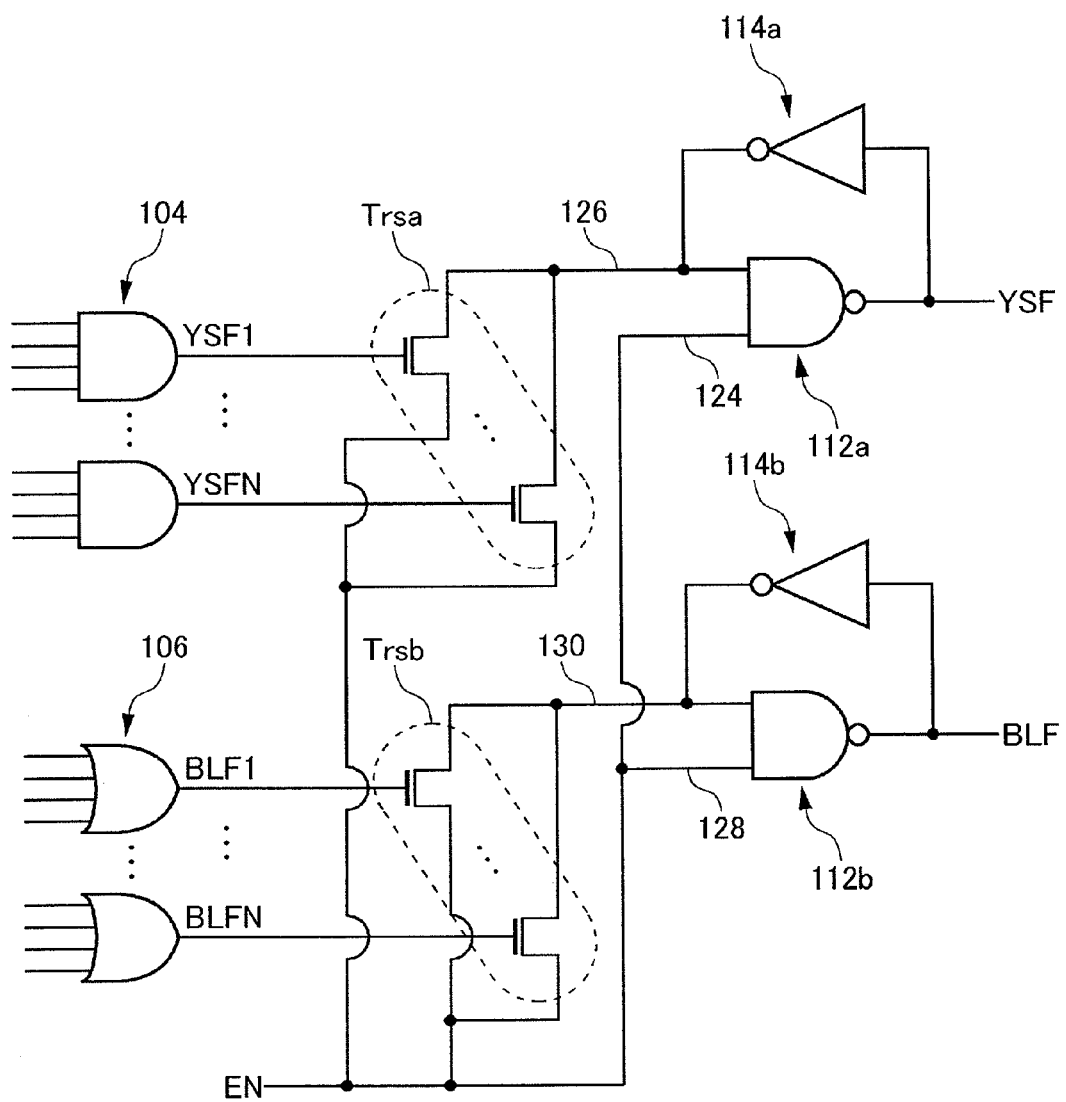
FIG. 12 is a circuit diagram of a parallel output type test control circuit according to the present embodiment.

FIG. 12 is a circuit diagram of a parallel output type test control circuit 108 according to the present embodiment. The test control circuit 108 receives first decision signals YSF1 to YFSN and a plurality of second decision signals BLF1 to BLFN from targets of a plurality of bit line groups BLs. Further, a test activation signal EN which becomes a high level (LOW→HIGH→LOW) is supplied as one shot pulse.

A NAND circuit 112a (first logical gate) of two inputs receives the test activation signal EN from two signal lines (first input signal lines). A NOT circuit 114a is arranged in parallel to the NAND circuit 112a. A first input signal line 124 receives the test activation signal EN as is, and a first input signal line 126 receives the test activation signal EN through a transistor groups Trsa. Conduction of these transistor groups Trsa is controlled according to the first decision signals YSF1 to YSFN. The first input signal line 126 employs a so-called "wired OR" configuration with respect to the plurality of first decision signals YSF1 to YSFN. When one of the transistors is placed in the on state, that is, when at least one of the first decision signals YSF is an activated state (HIGH) indicating contact failure, if the test activation signal EN of a high level one shot pulse is supplied, the NAND circuit 112a outputs "0". When all transistor groups Trsa are in the off state, that is, when all first decision signals YSF are also in the deactivated state (LOW), if the test activation signal EN is activated, the NAND circuit 112a outputs "1". With the output of the NAND circuit 112a, "0" indicates that "there is contact failure", and "1" indicates that "there is no contact failure".

A NAND circuit 112b (second logical gate) of two inputs receives the test activation signal EN from two signal lines (second input signal lines). A NOT circuit 114b is arranged in parallel to the NAND circuit 112b. A second input signal line 128 receives the test activation signal EN as is, and a second input signal line 130 receives the test activation signal EN through a transistor groups Trsb. Conduction of these transistor groups Trsb is controlled according to the second decision signals BLF1 to BLFN. The second input signal line 130 employs the "wired OR" configuration with respect to the plurality of second decision signals BLF1 to BLFN. When one of the transistors is placed in the on state, if the test activation signal EN of a high level one shot pulse is supplied, the NAND circuit 112b outputs "0". When all transistors are in the off state, if the test activation signal EN is activated, the NAND circuit 112b outputs "1". With the output of the NAND circuit 112b, "0" indicates that "there is line failure", and "1" indicates that "there is no line failure".

The parallel type test control circuit 108 illustrated in FIG. 12 simultaneously outputs a signal indicating whether or not contact failure occurs in a plurality of bit line groups BLs, and a signal indicating whether or not line failure occurs, from the NAND circuits 112a and 112b.

Figure 13:
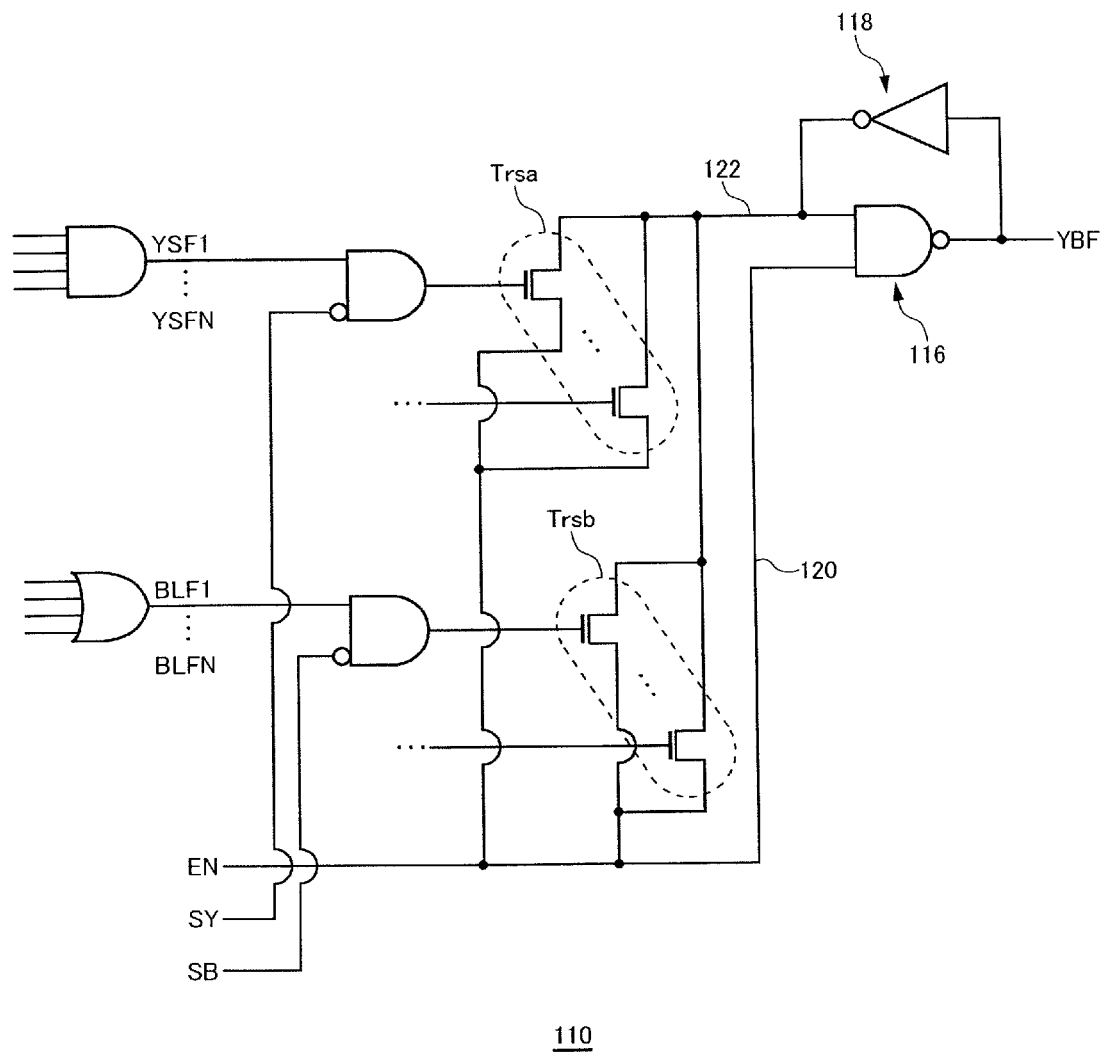
FIG. 13 is a circuit diagram of a serial output type test control circuit according to the present embodiment.

FIG. 13 is a circuit diagram of a serial output type test control circuit 110 according to the present embodiment. The test control circuit 110 receives a plurality of first decision signals YSF1 to YFSN and a plurality of second decision signals BLF1 to BLFN from targets of a plurality of bit line groups BLs. Further, a test activation signal EN which becomes a high level (LOW→HIGH→LOW) and selection signals SY and SB are supplied as one shot pulses.

A NAND circuit 116 (output logical gate) of two inputs receives the test activation signal EN from two input signal lines. A NOT circuit 118 is arranged in parallel to the NAND circuit 116. An output of the NAND circuit 116 indicates whether or not contact failure occurs or whether or not line failure occurs.

Of the two input signal lines of the NAND circuit 116, the test activation signal EN is inputted as is from an input signal line 120, and the test activation signal EN is inputted from an input signal line 122 through the transistor groups Trsa and Trsb. Of the input signal lines 122, a signal line in which the transistor group Trsa is inserted is a "first branch signal line", and a signal line in which the transistor group Trsb is inserted is a "second branch signal line". The first branch signal line employs the "wired OR" configuration with respect to a plurality of first decision signals YSF1 to YSFN, and the second branch signal line employs the "wired OR" configuration with respect to a plurality of second decision signals BLF1 to BLFN.

The selection signals SY and SB are low active signals, and these signals are normally in the off state. When the selection signal SY is selected and one of the first decision signals YSF1 to YSFN becomes high active, one of the transistor groups Trsa is conducted. When the test activation signal EN of a high level one shot pulse is supplied in this state, the NAND circuit 116 outputs "0". In other cases, the NAND circuit 116 outputs "1". With the output of the NAND circuit 116 upon activation of the selection signal SY, "0" indicates that "there is contact failure" and "1" indicates that "there is no contact failure".

When the selection signal SB is selected and one of the second decision signals BLF1 to BLFN becomes high active, one of the transistor groups Trsb is conducted. When the test activation signal EN of a high level one shot pulse is supplied in this state, the NAND circuit 116 outputs "0". In other cases, the NAND circuit 116 outputs "1". With the output of the NAND circuit 116 upon activation of the selection signal SB, "0" indicates that "there is line failure" and "1" indicates that "there is no line failure".

The serial type test control circuit 110 illustrated in FIG. 13 selectively outputs from the NAND circuit 116 a signal indicating whether or not contact failure occurs in a plurality of bit line groups BLs and a signal indicating whether or not line failure occurs. This selection is controlled according to the selection signals SY and SB.

The semiconductor device 10 has been described above based on the embodiment. According to the present embodiment, it is possible to efficiently find contact failure by comparing data of two bit line groups BLs. Further, there is also an advantage of making a circuit scale compact compared to the first comparison example and second comparison example. The test control circuits 108 and 110 can combine a plurality of contact failure signals YSF and bit line failure signals BLF to report to the outside whether contact failure occurs or line failure occurs in the semiconductor device 10.

The technical idea of the present application is applicable to a test circuit related to a plurality of various data lines (a plurality of data bus lines to which a selecting function is added, bit lines such as SRAM or non-volatile memory or data bus lines). Further, a circuit form in each circuit block disclosed in the drawings and a circuit which generates other control signals are by no means limited to the circuit form disclosed in the embodiment. How many local I/O lines LIO is set for one column selection signal line YS is arbitrary. With the test circuit according to the present application, it is preferable to set two or more local I/O lines LIO to detect both of contact failure and line failure in the failure detecting circuit 100b in FIG. 6.

The technical concept of the present invention may be applied to various semiconductor devices. For example, the present invention may be applied to semiconductor products in general, including functions as CPUs (Central Processing Units), MCUs (Micro Control Units), DSPs (Digital Signal Processors), ASICs (Application Specific Integrated Circuits), ASSPs (Application Specific Standard Products), and memories. Examples of the product types of the semiconductor devices to which the present invention is applicable include an SOC (System On Chip), MCP (Multi Chip Package), and POP (Package On Package). The present invention may be applied to semiconductor devices that have any of such product types and package types.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention. For example, in the test control circuit 108, the source side employing the "wired OR" configuration may have a fixed potential. Reset terminals may be provided in a first logical gate and a second logical gate to precharge potentials of the first input signal line 126 and second input signal line 130 before the test activation signal EN is supplied. The same change may also be made in the test control circuit 110.

What is claimed is:

1. A semiconductor device comprising:
   a selection signal line supplied with a selection signal;
   a plurality of first and second local I/O lines;
   a plurality of first and second bit lines;
   a plurality of first transistors each having a control electrode, each of the first transistors being coupled between an associated one of the first local I/O lines and an associated one of the first bit lines;
   a plurality of second transistors each having a control electrode, each of the second transistors being coupled between an associated one of the second local I/O lines and an associated one of the second bit lines;
   a first via conductor coupled between the selection signal line and the control electrodes of the first transistors;
   a second via conductor coupled between the selection signal line and the control electrodes of the second transistors; and
   a failure detecting circuit that detects a defect of at least one of the first and second via conductors by comparing a plurality of first data on the first local I/O lines read from the first bit lines and a plurality of second data on the second local I/O lines read from the second bit lines.

2. The semiconductor device as claimed in claim 1, wherein the failure detecting circuit includes:
   a plurality of first comparing circuits each activating a comparison result signal when a logic level of an associated one of the first data is not coincident with a logic level of an associated one of the second data; and
   a second comparing circuit activating a first detection signal when all of the comparison result signals are activated, the first detection signal indicating the defect of at least one of the first and second via conductors.

3. The semiconductor device as claimed in claim 2, wherein the failure detecting circuit further detects a defect of at least one of the first and second bit lines by comparing the first data and the second data.

4. The semiconductor device as claimed in claim 3, wherein the failure detecting circuit further includes a third comparing circuit activating a second detection signal when at least one of the comparison result signals is activated, the second detection signal indicating the defect of at least one the first and second bit lines.

5. The semiconductor device as claimed in claim 4, further comprising a test control circuit that outputs test result signals based on the first and second detection signals simultaneously to two different nodes when a test activation signal is activated.

6. The semiconductor device as claimed in claim 5, wherein the test control circuit includes:
   a first logical gate circuit that receives the test activation signal via a first input signal line; and
   a first switch circuit inserted into the first input signal line, the first switch circuit being controlled by the first decision signal.

7. The semiconductor device as claimed in claim 6, wherein the first switch circuit is brought into an on state when at least one of a plurality of the first decision signals is activated.

8. The semiconductor device as claimed in claim 5, wherein the test control circuit includes:
   a second logical gate circuit that receives the test activation signal via a second input signal line; and
   a second switch circuit inserted into the second input signal line, the second switch circuit being controlled by the second decision signal.

9. The semiconductor device as claimed in claim 8, wherein the second switch circuit is brought into an on state when at least one of a plurality of the second decision signals is activated.

10. The semiconductor device as claimed in claim 4, further comprising a test control circuit that selectively outputs test result signals based on the first and second detection signals to a predetermined node.

11. The semiconductor device as claimed in claim 10, wherein the test control circuit includes:
    a third logical gate circuit that receives the test activation signal via third and fourth input signal lines;
    a third switch circuit inserted into the third input signal line, the third switch circuit being controlled by the first decision signal; and
    a fourth switch circuit inserted into the fourth input signal line, the fourth switch circuit being controlled by the second decision signal.

12. The semiconductor device as claimed in claim 11, wherein the third switch circuit is brought into an on state when at least one of a plurality of the first decision signals is activated.

13. The semiconductor device as claimed in claim 11, wherein the fourth switch circuit is brought into an on state when at least one of a plurality of the second decision signals is activated.

14. The semiconductor device as claimed in claim 2, further comprising a test control circuit that outputs test result signal based on the first detection signal to a first node.

15. The semiconductor device as claimed in claim 14, wherein the test control circuit includes:
    a first OR gate circuit that receives a plurality of the first decision signals; and
    a first latch circuit that receives an output signal of the first OR gate circuit and the test activation signal.

16. The semiconductor device as claimed in claim 15, wherein
    the failure detecting circuit further includes a third comparing circuit activating a second detection signal when at least one of the comparison result signals is activated, the second detection signal indicating the defect of at least one the first and second bit lines, and the test control circuit includes a second OR gate circuit that receives a plurality of the second decision signals, and a second latch circuit that receives an output signal of the second OR gate circuit and the test activation signal, thereby test result signal based on the second detection signal is supplied to a second node in response to the test activation signal.

17. The semiconductor device as claimed in claim 15, wherein the failure detecting circuit further includes a third comparing circuit activating a second detection signal when at least one of the comparison result signals is activated, the second detection signal indicating the defect of at least one the first and second bit lines, the test control circuit includes a second OR gate circuit that receives a plurality of the second decision signals, and the first latch circuit further receives an output signal of the second OR gate circuit, thereby one of test result signals based on the first and second detection signals is selectively supplied to the first node in response to the test activation signal.

18. The semiconductor device as claimed in claim 1, wherein the selection signal line is physically single signal line.

19. A semiconductor device, comprising:

first to fourth memory cells;

first to fourth bit lines connected to the respective first to fourth memory cells;

first to fourth transistors connected to the respective first to fourth bit lines;

first to fourth lines connected to the respective first to fourth transistors;

a selection signal line including a first branch line diverged from the selection signal line and a second branch line diverged from the selection line, the first branch line being connected to gates of the first and second transistors, the second branch line being connected to gates of the third and fourth transistors;

a first comparator including a first input connected to the first and third lines; and a second comparator including a second input connected to the second and fourth lines.

20. The semiconductor device as claimed in claim 19, further comprising:

a write circuit configured to write the same data into the first and fourth memory cells;

a read circuit configured to read a first value, a second value, a third value and fourth value from the first to fourth memory cells in which the same data is written, respectively, and transfer the first value to fourth values to the first to fourth lines, respectively; and an AND circuit including an input connected to outputs of the first and second comparators.

* * * * *